(12) United States Patent
Hirshberg

(10) Patent No.: US 9,664,897 B1
(45) Date of Patent: May 30, 2017

(54) APPARATUS WITH A ROTATABLE MEMS DEVICE

(71) Applicant: Intel Corporation, Santa Clara, CA (US)

(72) Inventor: Arnon Hirshberg, D.N. Misgav (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/883,474

(22) Filed: Oct. 14, 2015

(51) Int. Cl.
    *G02B 26/08* (2006.01)
    *G02B 26/10* (2006.01)
    *H02N 1/00* (2006.01)

(52) U.S. Cl.
    CPC ......... *G02B 26/085* (2013.01); *G02B 26/105* (2013.01); *H02N 1/006* (2013.01)

(58) Field of Classification Search
    CPC .. G02B 26/08; G02B 26/085; G02B 26/0833; G02B 26/101; H02K 15/02; H02K 15/06; H02K 7/14; H02K 1/22; H02K 1/17; H02K 33/18; B81B 7/02
    USPC ..... 359/198.1, 200.7, 290, 291, 872; 310/36
    See application file for complete search history.

(56) References Cited

U.S. PATENT DOCUMENTS

| | | | |
|---|---|---|---|
| 5,912,608 A * | 6/1999 | Asada ..................... | H02K 33/18 310/36 |
| 6,825,967 B1 | 11/2004 | Chong et al. | |
| 7,256,926 B2 * | 8/2007 | Kamiya ............... | G02B 26/085 359/224.1 |
| 8,693,075 B2 | 4/2014 | Nakao et al. | |
| 9,116,350 B2 | 8/2015 | Freedman et al. | |
| 2001/0030779 A1 | 10/2001 | Ho | |

(Continued)

FOREIGN PATENT DOCUMENTS

| | | |
|---|---|---|
| JP | 2006-018250 A | 1/2006 |
| JP | 2008-504574 A | 2/2008 |
| WO | WO0218979 A2 | 3/2002 |

OTHER PUBLICATIONS

Urey, H., et al.,"Optical performance requirements for MEMS-scanner based microdisplays," Conf. on MOEMS and Miniaturized Systems, SPIE vol. 4178, pp. 176-185, Santa Clara, California (2000).

(Continued)

*Primary Examiner* — Euncha Cherry
(74) *Attorney, Agent, or Firm* — Schwabe, Williamson & Wyatt, P.C.

(57) ABSTRACT

Embodiments of the present disclosure are directed toward an apparatus with a rotatable MEMS device. The apparatus may include a magnetic circuit with two magnets disposed opposite each other to produce a magnetic field between the magnets. The MEMS device may be placed in a frame disposed between the magnets. The MEMS device may include a driving coil disposed around the device, and may be rotatable around a first axis of the frame, in response to application of electromagnetic force produced by interaction of electric current to pass through the driving coil, with the magnetic field. The frame may include another driving coil, and may be rotatable around a second axis orthogonal to first axis, in response to application of electromagnetic force produced by interaction of electric current to pass through the second driving coil, with the magnetic field. Other embodiments may be described and/or claimed.

22 Claims, 4 Drawing Sheets

(56) References Cited

U.S. PATENT DOCUMENTS

| | | |
|---|---|---|
| 2002/0071166 A1 | 6/2002 | Jin et al. |
| 2002/0171901 A1 | 11/2002 | Bernstein |
| 2003/0007262 A1 | 1/2003 | Tsuboi et al. |
| 2003/0038693 A1 | 2/2003 | Tokuda et al. |
| 2004/0212907 A1 | 10/2004 | Mala et al. |
| 2005/0002085 A1 | 1/2005 | Matsui |
| 2005/0003631 A1 | 1/2005 | Feierabend et al. |
| 2006/0097053 A1 | 5/2006 | Jolivet et al. |
| 2007/0002159 A1 | 1/2007 | Olsen et al. |
| 2011/0013249 A1 | 1/2011 | Desai |
| 2011/0149362 A1 | 6/2011 | Moidu |
| 2011/0310452 A1 | 12/2011 | Lin |
| 2012/0146751 A1 | 6/2012 | Sprague et al. |
| 2012/0194207 A1 | 8/2012 | Vaganov et al. |
| 2014/0071510 A1 | 3/2014 | Mizuno et al. |
| 2014/0159827 A1 | 6/2014 | Hofmann et al. |
| 2014/0320944 A1 | 10/2014 | Lubianiker et al. |

OTHER PUBLICATIONS

Barak Freedman et al., "Electromagnetic MEMS Device", U.S. Appl. No. 14/971,070, filed Dec. 16, 2015, 48 pages.
Interntional Search Report and Written Opinion mailed Jan. 4, 2016, issued in International Application No. PCT/US2015/044686, 15 pages.
International Search Report and Written Opinion mailed Dec. 10, 2013 for International Application No. PCT/US2013/030286, 13 pages.
Office Action for Taiwan Application No. 103106271, dated Dec. 4, 2014, 15 pages.
International Preliminary Report on Patentability mailed Sep. 24, 2015 for International Application No. PCT/US2013/030286, 10 pages.
Non-Final Office Action mailed Oct. 22, 2014 for U.S. Appl. No. 13/997,986, 48 pages.
Final Office Action mailed Feb. 13, 2015 for U.S. Appl. No. 13/997,986, 11 pages.
Notice of Allowance mailed Apr. 27, 2015 for U.S. Appl. No. 13/997,986, 10 pages.
Office Action for Japanese Application No. 2015-505726, dated Sep. 1, 2015, 9 pages.
Office Action for Korean Application No. 2014-7027005, dated Sep. 18, 2015, 12 pages.
Office Action for Korean Application No. 2014-7027005, dated Mar. 25, 2016, 6 pages.
Non-Final Office Action mailed Sep. 28, 2016 for U.S. Appl. No. 14/971,070, 22 pages.
Non-Final Office Action mailed Sep. 28, 2016 for U.S. Application No. 14/530,375, 25 pages.
Office Action for Japanese Application No. 2015-505726, dated Mar. 1, 2016, 7 pages.
Barak Freedman et al., "Electromagnetic MEMS Device", U.S. Appl. No. 14/530,375, filed Oct. 31, 2014, 36 pages.
Barak Freedman et al., "Electromagnetic MEMS Device", PCT Application No. PCT/US15/44686, filed Aug. 11, 2015, 34 pages.
Arda D. Yalcinkaya et al., "Two-Axis Electromagnetic Microscanner for High Resolution Displays", Journal of Microelectromechanical Systems, vol. 15, No. 4, Aug. 2006, 10 pages.
International Search Report and Written Opinion mailed Dec. 9, 2016, issued in International Application No. PCT/US2016/051630, 15 pages.
Final Office Action mailed Feb. 7, 2017 for U.S. Appl. No. 14/530,375, 20 pages.
Final Office Action mailed Feb. 7, 2017 for U.S. Appl. No. 14/971,070, 25 pages.
Advisory Action mailed Mar. 24, 2017 for U.S. Appl. No. 14/971,070, 8 pages.

* cited by examiner

APPARATUS WITH A ROTATABLE MEMS DEVICE

FIELD

Embodiments of the present disclosure generally relate to the field of opto-electronics, and more particularly, actuation techniques for electromagnetic micro-electromechanical system (MEMS) devices.

BACKGROUND

Micro-electromechanical system (MEMS) devices are widely used as actuators, including magnetic actuators. Most magnetic actuators are based on electromagnetic force, which acts on a conductor with current running across a magnetic field. These actuators may comprise a magnetic circuit to produce the magnetic field and electric circuit to harvest the electromagnetic force by the running current. Typically, magnetic actuators may be realized using permanent magnets to create the magnetic field, and use a conductor coil to run current and displace the actuating element according to the applied electromagnetic force.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
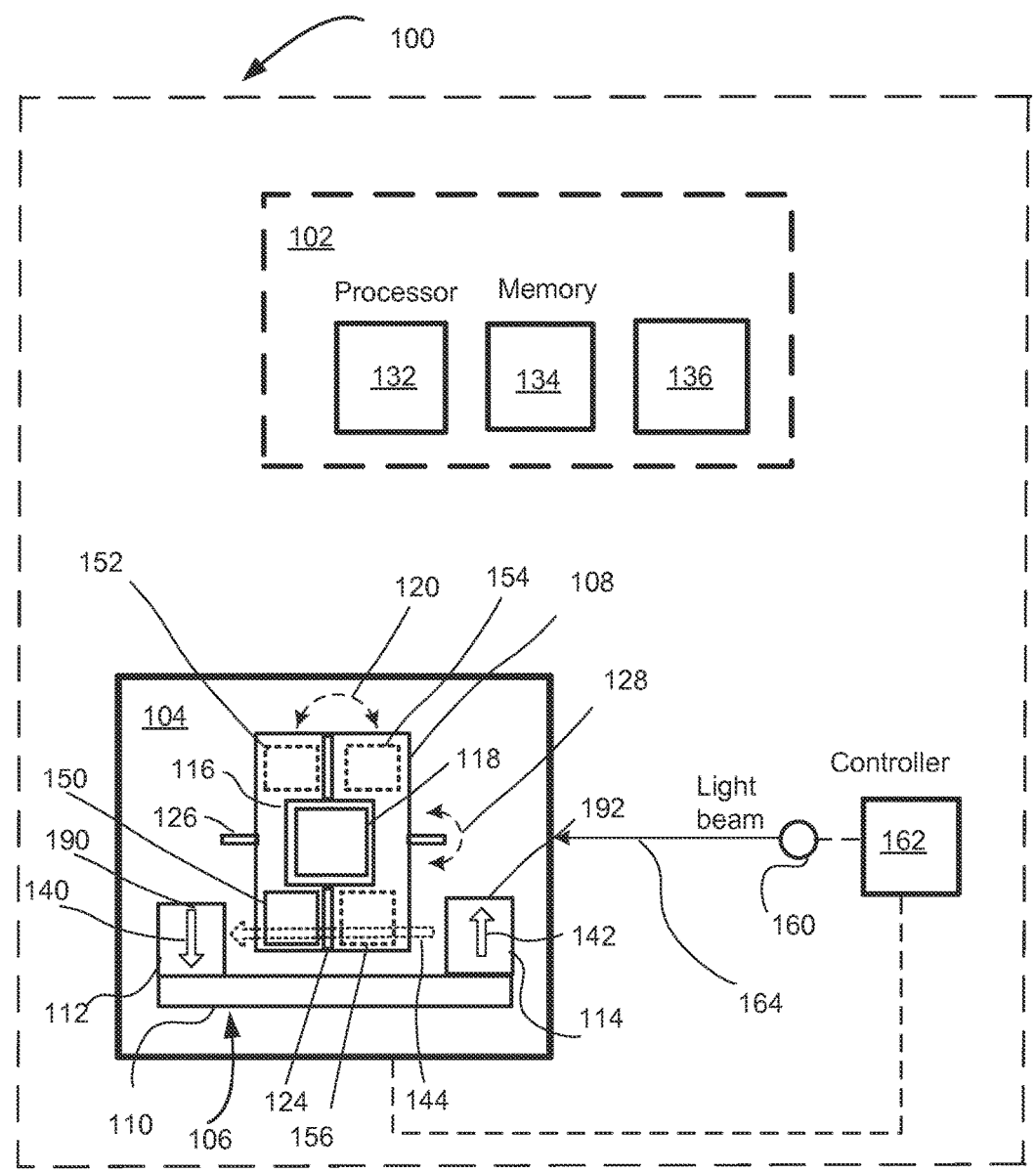
FIG. 1 schematically illustrates an example apparatus having a magnetic circuit and a MEMS device, in accordance with some embodiments of the present disclosure.

Embodiments of the present disclosure describe techniques and configurations for an apparatus with a rotatable MEMS device. The apparatus may include a magnetic circuit with two magnets that may be disposed opposite each other to produce a magnetic field between the magnets. The MEMS device may be placed in a frame disposed between the magnets. The MEMS device may include a driving coil disposed around the MEMS device, and may be rotatable around a first axis coupled with the frame, in response to application of electromagnetic force produced by interaction of electric current to pass through the driving coil, with the magnetic field. The frame may include at least another driving coil, and may be rotatable around a second axis substantially orthogonal to the first axis, in response to application of electromagnetic force produced by interaction of electric current to pass through the second driving coil, with the magnetic field.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

FIG. 1 schematically illustrates an example apparatus 100 having a magnetic circuit and a MEMS device, in accordance with some embodiments of the present disclosure. In some embodiments, as illustrated, the device 100 may include a data processing module 102 and an optical device (e.g., scanner module) 104 coupled with the data processing module 102.

The data processing module 102 may comprise a number of components. The components may include a processor 132, coupled with a memory 134 configured to enable the above-noted and other functionalities of the apparatus 100. For example, the processor 132 may be configured with executable instructions stored in the memory 134 to enable operations of the optical scanner module 104. In some embodiments, the data processing module 102 may further include additional components 136 that may be necessary for operation of the apparatus 100, but are not the subject of the present disclosure. For example, the processor 132, the memory 134, and/or other components 136 may comport with a processor-based system that may be a part of, or include, the apparatus 100, in accordance with some embodiments.

The processor 132 may be packaged together with computational logic, e.g., stored in the memory 134, and configured to practice aspects of embodiments described herein, such as optical device 104's operation, to form a System in Package (SiP) or a System on Chip (SoC). The processor 132 may include any type of processors, such as a central processing unit (CPU), a microprocessor, and the like. The processor 132 may be implemented as an integrated circuit having multi-cores, e.g., a multi-core microprocessor. The memory 134 may include temporal and/or persistent storage of any type, including, but not limited to, volatile and non-volatile memory, and other components 136 may include a mass storage device, such as optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The optical device 104 may include a magnetic circuit 106 and a frame 108 including a MEMS device 116, coupled with the magnetic circuit 106. The magnetic circuit 106 may include a base 110 and first and second magnets 112, 114 disposed at different sides of the base 110 opposite each other. As will be described below in greater detail, the first and second magnets 112, 114 may be magnetized substantially vertically to the base and in opposite directions to each other (as indicated by arrows 140, 142) to produce a substantially horizontal magnetic field 144 between the first and second magnets 112, 114.

Figure 2:
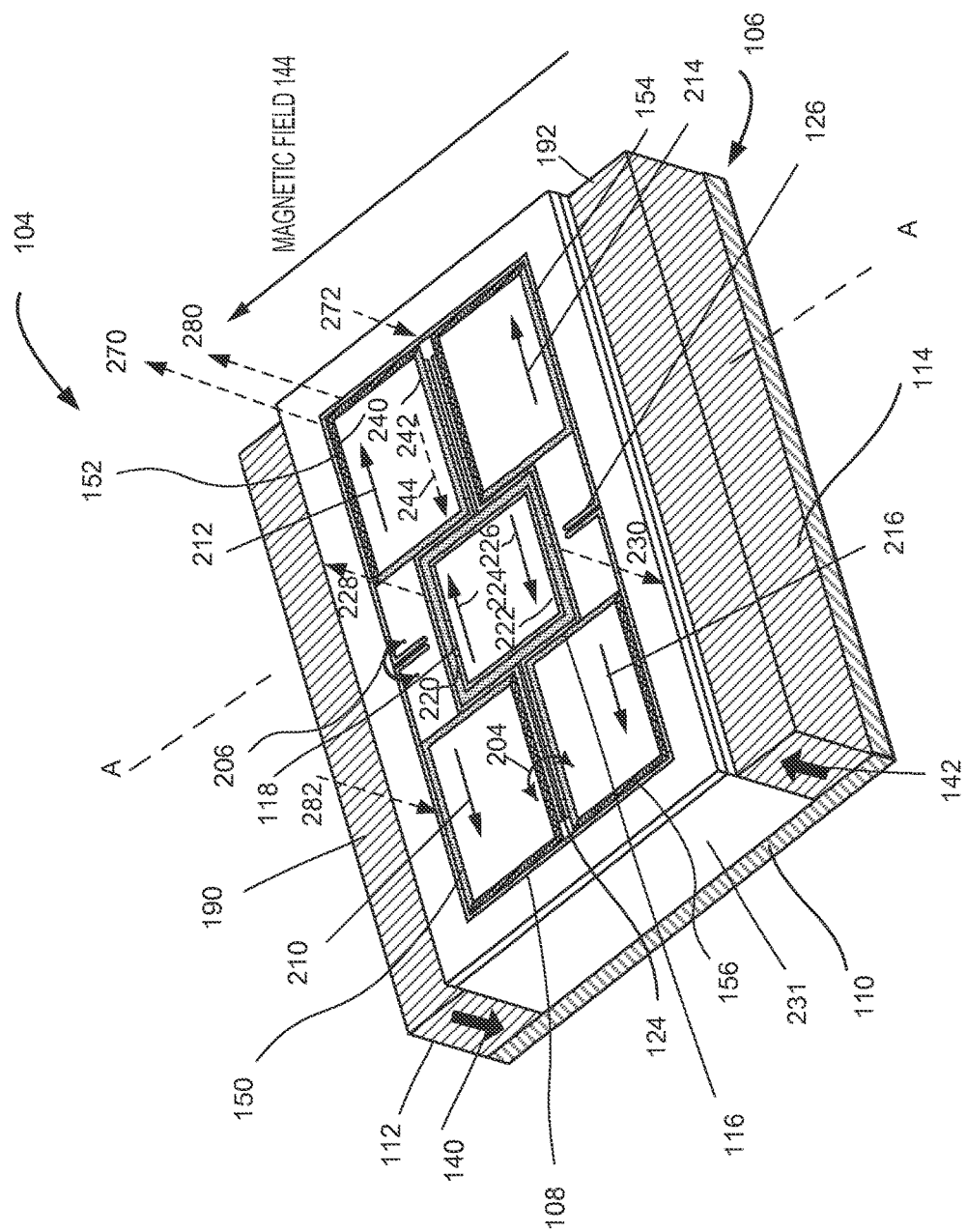
FIG. 2 is a three-dimensional perspective view of a portion of the apparatus of FIG. 1, in accordance with some embodiments.
Figure 3:
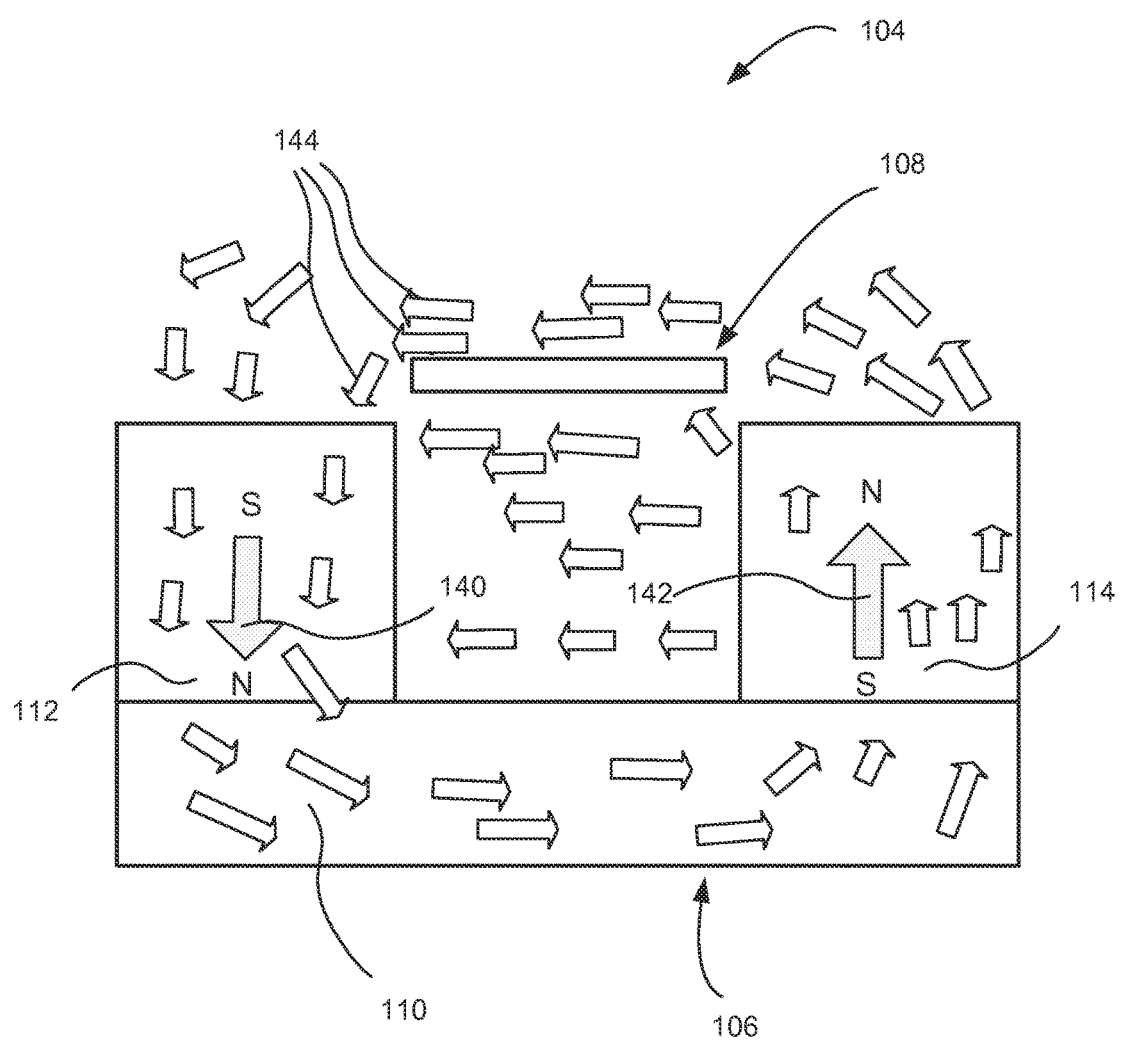
FIG. 3 is a cross-sectional schematic view of the portion of the apparatus of FIG. 1, in accordance with some embodiments.

For simplicity of description, the frame 108 with the MEMS device 116 is depicted in FIG. 1 out of plane with top surfaces 190, 192 of magnets 112 and 114, while in some embodiments it may be disposed in a plane that is parallel to the surfaces 190, 192, as described in greater detail in reference to FIGS. 2-3.

As shown, the frame 108 with the MEMS device 116 may be disposed substantially between the magnets 112, 114 of the magnetic circuit 106. In embodiments, the MEMS device 116 may comprise a mirror and include a first driving coil 118 (e.g., comprising a frame-like shape) disposed substantially around the MEMS device 116 as shown. The MEMS device 116 may be at least partially rotatable (e.g., tiltable) 120 around a first axis 124, in response to application of electromagnetic force produced by interaction of electric current passing through the coil 118 with magnetic field 144. The substantially horizontal magnetic field 144 produced by the magnetic circuit 106 may pass the driving coil 118 substantially perpendicularly.

The frame 108 may also be at least partially rotatable (e.g., tiltable) around a second axis 126, which may be disposed in the optical device 104. The second axis 126 may be positioned to be substantially orthogonal to the first axis 124. The frame 108 may further include at least one second driving coil 150 disposed within the frame 108, as shown. In embodiments, the frame 108 may be at least partially rotatable 128 around the second axis 126 in response to application of a second electromagnetic force produced by interaction of electric current to pass through the second driving coil 150, with the magnetic field 144.

In some embodiments, the frame 108 may include multiple driving coils, in order to provide desired torque for the frame 108 rotation around the second axis 126. For example, the frame 108 may include four driving coils 150, 152, 154, and 156 (the latter three are shown in broken lines) disposed within the frame 108. In some embodiments, the driving coils 150, 152, 154, and 156 may be connected is series or any other paired combination. The driving coils 150, 152, 154, and 156 may be connected in series to coil 118.

The apparatus 100 components (e.g., components 136) may further include a light source 160 configured to emit light. In some embodiments, the light source 160 may comprise a laser device configured to provide a light beam 164, coupled with a controller 162. In some embodiments, the memory 134 may include instructions that, when executed on the processor 132, may configure the controller 162 to control the intensity and/or direction of the light beam 164 produced by the light source 160. Additionally or alternatively, in some embodiments, the memory 134 may include instructions that, when executed on the processor 132, may configure the controller 162 to control current supply to the optical device 104 (e.g., to the coils 118, 150, 152, 154, 156). In some embodiments, the controller 162 may be implemented as a software component stored, e.g., in the memory 134 and configured to execute on the processor 132. In some embodiments, the controller 162 may be implemented as a combination of software and hardware components. In some embodiments, the controller 162 may include a hardware implementation. The details of the functional implementation of the controller 162 are not the subject of the present disclosure.

The data processing module 102 and optical device 104 may be coupled with one or more interfaces (not shown) configured to facilitate information exchange among the above-mentioned components. Communications interface(s) (not shown) may provide an interface for the apparatus 100 to communicate over one or more wired or wireless network(s) and/or with any other suitable device. In various embodiments, the apparatus 100 may have more or fewer components, and/or different architectures. In some embodiments, the apparatus 100 may comprise an apparatus for a three-dimensional (3D) object acquisition, such as a 3D scanner, a 3D camera, a 3D projector, a gesture recognition device, a game console, a laser display, or any other device configured for a 3D object acquisition or projection. In some embodiments, the apparatus 100 may be a two-dimensional (2D) image projector. In various embodiments, techniques and configurations described herein may be used in a variety of systems that benefit from the principles described herein, such as optoelectronic, electro-optical, MEMS devices (e.g., 116) and systems, and the like.

FIG. 2 is an example 3D perspective view of a portion of the apparatus 100, such as optical device 104, in accordance with some embodiments. For description purposes, like components of the apparatus of FIGS. 1 and 2 are indicated with like numbers. As described in reference to FIG. 1, the device 104 may include the magnetic circuit 106 and the frame 108 having the MEMS device 116, and electromagnetically coupled with the magnetic circuit 106.

As shown, the apparatus 100 may include the magnetic circuit 106 and the frame 108 with MEMS device 116. The MEMS device 116 may comprise a MEMS die 231 forming a MEMS device body. The magnetic circuit 106 may include first and second magnets 112, 114 that may be disposed on the base 110 and magnetized substantially vertically to the base 110 and in opposite directions to each other, as indicated by the respective polarities of magnets 140 and 142. The base 110 may comprise a magnetic material and have a substantially flat surface on which the magnets 112 and 114 may be disposed.

The first and second magnets 112, 114 of the magnetic circuit 106 may comprise permanent magnets having substantially rectangular prismatic shapes, as shown in FIG. 2. Accordingly, when disposed on the substantially flat surface of the base 110, the first and second magnets 112, 114 may produce a magnetic field 144 that may flow substantially horizontally between the magnets 112, 114, as shown in greater detail in FIG. 3.

FIG. 3 illustrates an example cross-sectional schematic view a portion of the apparatus 100, namely, of the optical device 104 of FIGS. 1-2, in accordance with some embodiments. The cross-section is taken as indicated by dashed line A in FIG. 2. Like components of FIGS. 1, 2, and 3 are indicated by like numerals.

The magnetic field 144 may be produced (induced) by a combination of the substantially flat base 110 and first and second magnets 112, 114 disposed vertically on the base 210, and having polarity indicated by arrows 140 and 142 and designations "N" and "S." As shown, the magnetic field 144 may depart, e.g., from North Pole "N" of the second magnet 114, flow substantially horizontally between the second and first magnets 114, 114 and through the frame 108 with the MEMS device (not shown), and sump to the South Pole "S" of the first magnet 112. Accordingly, the magnetic field 144 may pass the driving coils (not shown) disposed in the frame 108 and MEMS device substantially perpendicularly. It will be understood that the magnetic field direction 144 may be created in many different ways. Using plate 110 and magnets 112 and 114 magnetized in directions 140 and 142 illustrate but one example of the creations of a desired magnetic field.

Referring again to FIG. 2, the driving coil 118 may be disposed about the perimeter of the MEMS device 116 (for example, looped substantially around the MEMS device 116, as shown) to pass electric current 224 to interact with the magnetic field 144. The MEMS device 116 may be partially rotatable 204 (e.g., tiltable) around the axis 124. In some embodiments, the MEMS device 116 may comprise a mirror, and the frame 108 with the MEMS device 116 may be disposed substantially above a plane formed by top surfaces 190 and 192 of the magnets 112 and 114, to provide an unobstructed field of view (FOV) for the mirror when the MEMS device is rotated around the axis 124.

The direction of current passing through the driving coil 118 may be perpendicular to a direction of the magnetic field 144 in at least portions of the driving coil 118, to enable production of electromagnetic force in response to interaction of the current with the magnetic field 144. For example, the current passing the sides 220 and 222 of the driving coil 118 in respective directions 224 and 226 may produce respective electromagnetic forces indicated by dashed arrows 228 and 230, thus creating a desired torque for rotating the MEMS device 116.

The frame 108 may be partially rotatable 206 (e.g., tiltable) around the axis 126. The axis 126 may be disposed substantially orthogonally to the axis 124. As described above, the frame 108 may include one or more driving coils 150, 152, 154, 156 disposed as shown in FIG. 2. In embodiments, one driving coil, such as e.g., coil 152, may be sufficient to create an electromagnetic force sufficient to rotate the frame 108. The driving coil 152 may be disposed anywhere inside the frame 108, as the structural limitations of the frame permit such disposition. For example, the perimeter of the driving coil 152 may be smaller than a perimeter of the frame 108, in order to accommodate the disposition of the driving coil 152 inside the frame 108, without overlapping with the MEMS device 116 also disposed in the frame 108. In some embodiments, for the purposes of providing desired torque around the axis 126, more than one driving coil 152 may be disposed inside the frame 108, as shown in FIG. 2.

For example, driving coils 150, 154, 156, may be disposed in the frame 108 in addition (or in the alternative) to the driving coil 152. For example, the frame 108 may comprise imaginary portions (e.g., quadrants) defined by respective positions of the axis 124, 126 relative to the frame 108. The driving coils 150, 152, 154, 156 may be disposed in the four quadrants of the frame 108, as shown in FIG. 2. As shown, the frame 108 and the driving coils 150, 152, 154, 156 may have substantially rectangular shapes. In some embodiments, the frame 108 and the driving coils 150, 152, 154, 156 may have different shapes, such as elliptical, square, and the like. Electric currents may pass through the driving coils 150, 152, 154, and 156 in indicated directions 210, 212, 214, and 216 respectively. As shown, the currents may be perpendicular to a direction of the magnetic field 144 (at least when passing through sides of the driving coils that are positioned perpendicular to the magnetic field 144), to enable production of the electromagnetic forces that may cause rotation of the frame 108. One skilled in the art will appreciate that to enable production of the electromagnetic forces that may cause rotation of the frame 108, the directions 212 and 214 may be the same, and may be opposite to 210 and 216. In other words, the directions of the currents through the driving coils 150, 152, 154, and 156 may be respectively opposite to ones illustrated in FIG. 2, e.g., 210, 212, 214, and 216.

For example, the driving coil 152 may have two opposite sides 240 and 242, as shown. Electric current may be flowing through the side 240 in the direction 212, and through the side 242 in the direction indicated by dashed arrow 244. Current flowing through the sides 240 and 242 may interact with magnetic field 144 to produce a resulting electromagnetic force 270. For example, when the plane of the frame 108 is substantially parallel to the surface of the die 231, the resulting electromagnetic force 280 may be directed substantially perpendicular to and outward the surface of the die 231, to enable rotation 206 of the frame 108 around the axis 126.

As described above, the electromagnetic force 280 may be produced, at least in part, by interaction of the current flowing in direction 212 and opposite direction 244 with the magnetic field 144. Accordingly, the resulting electromagnetic force 280 may be in part comprised by portions of electromagnetic forces produced by current flowing through the sides 240 and 242 of the driving coil 152, perpendicular to the magnetic field 144.

In the above example of the frame 108 being substantially parallel to the surface of the die 231, the side 240 of the driving coil 118 may be located closer to the first magnet 112 than the side 240. Accordingly, the portion of the electromagnetic force produced by the current flowing through the side 240 may be stronger than the portion of the electromagnetic force produced by the current flowing through the side 242 of the driving coil 152. The portion of the electromagnetic force produced by the current flowing through the side 240 may be directed substantially perpendicular to and outward the surface of the die 231, as shown by arrow 270. The portion of the electromagnetic force produced by the current flowing the side 242 may be directed substantially perpendicular and inside the surface of the die 231, as shown by arrow 272. The resulting electromagnetic force 280 comprising at least in part an algebraic sum of the portions 270 and 272 may be directed substantially perpendicular to and outward the surface of the die 231. Similarly, the electromagnetic force 282 produced by interaction of the electric current 210 flowing through the frame 150 in the direction opposite the current 212, with magnetic field 144, may be directed substantially perpendicular to and inside the surface of the die 231.

The same considerations may apply to the electromagnetic forces produced by currents 214, 210, and 216 flowing through the driving coils 154, 150, and 156 and interacting with magnetic field 144. The combination of forces 280 and 282 (and forces produced by currents 214 and 216) applied to opposite sides of the frame 108 may create desired torque to provide rotation of the frame 108 around the axis 126. The current supply circuit (not shown) may be configured to enable the currents passing through the driving coils 150, 152, 154, 156 to flow in the directions indicated by 210, 212, 214, and 216, in order to provide a desired torque for the frame 108. For example, driving coils 150, 152, 154, 156 may be connected in series or in pairs to enable the provision of the currents in the indicated directions. Driving coils 150, 152, 154, 156 may also be connected to coil 118 in series to enable the provision of the currents in the indicated directions.

If directions 210 and 216 are the same as 212 and 214, force 282 may be the same as 280 and may create an up-down movement of the frame 108. This movement may be used, for example, for auto focus or other optical display translation. Further, separate control of the two coil pairs 150 and 156, and 152 and 154 may provide for a combined tilt and up-down displacement of the frame 108.

Figure 4:
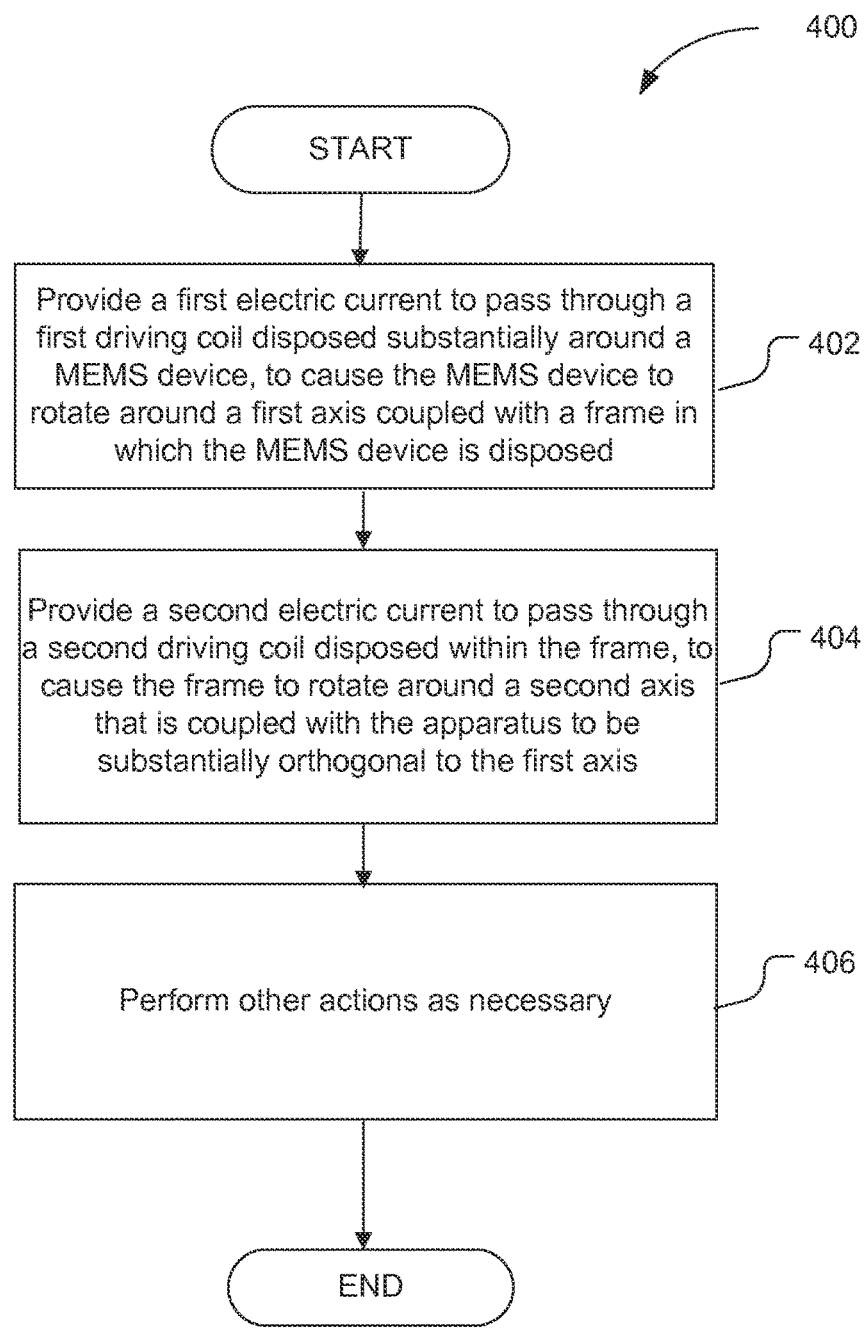
FIG. 4 is a process flow diagram for actuating a MEMS device of an apparatus comprising a magnetic circuit coupled with the MEMS device, in accordance with some embodiments.

FIG. 4 is a process flow diagram for actuating a MEMS device of an apparatus comprising a magnetic circuit coupled with the MEMS device, in accordance with some embodiments. The process 400 may comport with actions described in connection with FIGS. 1-3 in some embodiments. It will be appreciated that the actions described below may not necessarily be taken in the described sequence. Some actions (e.g., described in reference to block 404) may precede others (e.g., described in reference to blocks 402) or take place substantially simultaneously.

At block 402, the process 400 may include providing a first electric current to pass through a first driving coil (e.g., 118) disposed substantially around a MEMS device (e.g., 116), to cause the MEMS device to rotate around a first axis (e.g., 124) coupled with a frame (e.g., 108) in which the MEMS device is disposed, in response to application of a first electromagnetic force (e.g., 228) produced by interaction of the first electric current (e.g., 224) with magnetic field (e.g., 144) produced by magnets (e.g., 112, 114) disposed opposite each other and magnetized in opposite directions to each other.

At block 404, the process 400 may include providing a second electric current (e.g., 212) to pass through a second driving coil (e.g., 152) disposed within the frame, to cause the frame to rotate around a second axis (e.g., 126) that is coupled with the apparatus to be substantially orthogonal to the first axis (e.g., 124), in response to application of a second electromagnetic force (e.g., 280) produced by interaction of the second electric current (e.g., 212) with the magnetic field (e.g., 144).

At block 406, other actions may be performed as necessary. For example, the frame may comprise a first portion, a second portion, a third portion, and a fourth portion, which may be defined at least in part by respective positions of the first and second axes relative to the frame, as described in reference to FIG. 2. The second driving coil may be disposed in the first portion of the frame. The process 400 may further include providing a third electric current to a third driving coil disposed in the second portion, to interact with the magnetic field; providing a fourth electric current to a fourth driving coil disposed in the third portion, to interact with the magnetic field; and providing a fifth electric current to a fifth driving coil disposed in the fourth portion, to interact with the magnetic field. The interaction of the currents with the magnetic field may cause the frame to further rotate around the second axis in response to application of the second electromagnetic force produced by interactions of second, third, fourth, and fifth electric currents with the magnetic field.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

The embodiments described herein may be further illustrated by the following examples.

Example 1 is an apparatus with a rotatable MEMS device, comprising: a magnetic circuit including first and second magnets disposed opposite each other and magnetized in opposite directions to each other, to produce a magnetic field substantially between the first and second magnets; and a frame that includes a MEMS device, and is disposed substantially between the first and second magnets of the magnetic circuit, wherein the MEMS device includes a first driving coil disposed substantially around the MEMS device, and is at least partially rotatable around a first axis of the frame, in response to application of a first electromagnetic force produced by interaction of a first electric current to pass through the first driving coil, with the magnetic field, wherein the frame further includes a second driving coil disposed within the frame, and is at least partially rotatable around a second axis of the apparatus that is substantially orthogonal to the first axis, in response to application of a second electromagnetic force produced by interaction of a second electric current to pass through the second driving coil, with the magnetic field.

Example 2 may include the subject matter of Example 1, wherein the first and second driving coils are disposed in the MEMS device and in the frame respectively to provide directions of first and second currents to pass through the first and second driving coils that are, at least in portions of the coils, perpendicular to a direction of the magnetic field, to enable production of the first and second electromagnetic forces.

Example 3 may include the subject matter of Example 1, wherein the frame and the second driving coil have substantially rectangular shapes, and wherein a perimeter of the second driving coil is smaller than a perimeter of the frame.

Example 4 may include the subject matter of Example 3, wherein the frame comprises a first portion, a second portion, a third portion, and a fourth portion, wherein the portions are defined at least in part by respective positions of the first and second axis relative to the frame, wherein the second driving coil is disposed in the first portion, wherein the frame further includes: a third driving coil disposed in the second portion, to pass a third electric current to interact with the magnetic field; a fourth driving coil disposed in the third portion, to pass a fourth electric current to interact with the magnetic field; a fifth driving coil disposed in the fourth portion, to pass a fifth electric current to interact with the magnetic field; wherein the frame is further rotatable around the second axis in response to application of the second electromagnetic force produced by interactions of second, third, fourth, and fifth electric currents with the magnetic field.

Example 5 may include the subject matter of Example 4, wherein the second, third, fourth, and fifth driving coils are connected in series or in pairs, to provide various directions of the second, third, fourth, and fifth electric currents in relation to the magnetic field.

Example 6 may include the subject matter of Example 5, wherein the second and fifth electric currents are to interact with the magnetic field to produce a first portion of the second electromagnetic force, and wherein the third and fourth electric currents are to interact with the magnetic field to produce a second portion of the second electromagnetic force, and wherein the first and second portions of the second electromagnetic force provide a torque to rotate the frame.

Example 7 may include the subject matter of Example 1, wherein the first and second coils are connected in series, to provide various directions of the first and second electric currents in relation to the magnetic field.

Example 8 may include the subject matter of Example 1, wherein the magnetic circuit further includes a base with a substantially flat surface, wherein the base of the magnetic circuit comprises a magnetic material, wherein the first and second magnets are disposed on the substantially flat surface of the base.

Example 9 may include the subject matter of Example 7, wherein the first and second magnets of the magnetic circuit comprise permanent magnets having substantially rectangular prismatic shapes, to provide the magnetic field substantially between the first and second magnets.

Example 10 may include the subject matter of Example 8, wherein the MEMS device comprises a mirror and is further disposed above a plane formed by top surfaces of the first and second magnets, to provide an unobstructed FOV for the mirror when the MEMS device is rotated.

Example 11 may include the subject matter of any of Examples 1 to 10, further comprising a die to form a body of the MEMS device, wherein the die comprises the second axis, and wherein the apparatus comprises an integrated circuit.

Example 12 is an apparatus with a rotatable MEMS device, comprising: a processor; and an optical scanner module coupled with the processor to provide scan data to the processor, wherein the optical scanner module includes a magnetic circuit to produce a magnetic field, and a frame that includes a MEMS device to generate the scan data, and that is disposed substantially inside the magnetic field, wherein the MEMS device includes a first driving coil disposed substantially around the MEMS device, and is at least partially rotatable around a first axis coupled with the frame, in response to application of a first electromagnetic force produced by interaction of a first electric current to pass through the first driving coil, with the magnetic field, wherein the frame further includes a second driving coil disposed within the frame, and is at least partially rotatable around a second axis that is coupled with the apparatus to be substantially orthogonal to the first axis, in response to application of a second electromagnetic force produced by interaction of a second electric current to pass through the second driving coil, with the magnetic field.

Example 13 may include the subject matter of Example 12, wherein the magnetic circuit includes first and second magnets disposed opposite each other and magnetized in opposite directions to each other to produce the electromagnetic field, wherein the frame is disposed substantially between the first and second magnets of the magnetic circuit.

Example 14 may include the subject matter of any of Examples 12 to 13, wherein the frame and the second driving coil have substantially rectangular shapes, wherein a perimeter of the second driving coil is smaller than a perimeter of the frame.

Example 15 may include the subject matter of Example 14, wherein the frame comprises a first portion, a second portion, a third portion, and a fourth portion, wherein the portions are defined at least in part by respective positions of the first and second axis relative to the frame, wherein the second driving coil is disposed in the first portion, wherein the frame further includes: a third driving coil disposed in the second portion, to pass a third electric current to interact with the magnetic field; a fourth driving coil disposed in the third portion, to pass a fourth electric current to interact with the magnetic field; a fifth driving coil disposed in the fourth portion, to pass a fifth electric current to interact with the magnetic field; wherein the frame is further rotatable around the second axis in response to application of the second electromagnetic force produced by interactions of second, third, fourth, and fifth electric currents with the magnetic field.

Example 16 may include the subject matter of Example 15, wherein the second, third, fourth, and fifth driving coils are connected in series or in pairs, to provide various directions of the second, third, fourth, and fifth electric currents in relation to the magnetic field.

Example 17 may include the subject matter of Example 12, wherein the apparatus comprises a 3D object acquisition device, wherein the device includes one of a 3D scanner, a 3D camera, a 3D projector, an ultrabook, or a gesture recognition device.

Example 18 is method of actuating a MEMS device of an apparatus, comprising: providing a first electric current to pass through a first driving coil disposed substantially around a MEMS device, to cause the MEMS device to rotate around a first axis coupled with a frame in which the MEMS device is disposed in the apparatus, in response to application of a first electromagnetic force produced by interaction of the first electric current with a magnetic field produced by a magnetic circuit of the apparatus; providing a second electric current to pass through a second driving coil disposed within the frame, to cause the frame to rotate around a second axis that is coupled with the apparatus to be substantially orthogonal to the first axis, in response to application of a second electromagnetic force produced by interaction of the second electric current with the magnetic field.

Example 19 may include the subject matter of Example 18, further comprising: causing the electromagnetic circuit of the apparatus to produce the electromagnetic field, wherein the magnetic circuit includes first and second magnets disposed opposite each other and magnetized in opposite directions to each other to produce the magnetic field, wherein the frame is substantially disposed between the first and second magnets.

Example 20 may include the subject matter of Example 18, wherein the frame and the second driving coil have substantially rectangular shapes, wherein a perimeter of the second driving coil is smaller than a perimeter of the frame.

Example 21 may include the subject matter of Example 20, wherein the frame comprises a first portion, a second portion, a third portion, and a fourth portion, wherein the portions are defined at least in part by respective positions of the first and second axes relative to the frame, wherein the second driving coil is disposed in the first portion of the frame, wherein the method further includes: providing a third electric current to a third driving coil disposed in the second portion, to interact with the magnetic field; providing a fourth electric current to a fourth driving coil disposed in the third portion, to interact with the magnetic field; and providing a fifth electric current to a fifth driving coil disposed in the fourth portion, to interact with the magnetic field, to cause the frame to further rotate around the second axis in response to application of the second electromagnetic force produced by interactions of second, third, fourth, and fifth electric currents with the magnetic field.

Example 22 may include the subject matter of Example 21, wherein providing second, third, fourth, and fifth electric currents includes providing a sixth current to the second, third, fourth, and fifth driving coils, wherein the coils are connected in series or in pairs.

Example 23 is an apparatus with a rotatable MEMS device, comprising: means for providing a first electric current to pass through a first driving coil disposed substantially around a MEMS device, to cause the MEMS device to rotate around a first axis coupled with a frame in which the MEMS device is disposed in the apparatus, in response to application of a first electromagnetic force produced by interaction of the first electric current with a magnetic field produced by the apparatus; and means for providing a second electric current to pass through a second driving coil disposed within the frame, to cause the frame to rotate around a second axis that is coupled with the apparatus to be substantially orthogonal to the first axis, in response to application of a second electromagnetic force produced by interaction of the second electric current with the magnetic field.

Example 24 may include the subject matter of Example 23, further comprising: means for providing the electromagnetic field, including first and second magnets disposed opposite each other and magnetized in opposite directions to each other to produce the magnetic field, wherein the frame is substantially disposed between the first and second magnets.

Example 25 may include the subject matter of Example 23, wherein the frame and the second driving coil have substantially rectangular shapes, wherein a perimeter of the second driving coil is smaller than a perimeter of the frame.

Example 26 may include the subject matter of Example 25, wherein the frame comprises a first portion, a second portion, a third portion, and a fourth portion, wherein the portions are defined at least in part by respective positions of the first and second axes relative to the frame, wherein the second driving coil is disposed in the first portion of the frame, wherein the apparatus further includes: means for providing a third electric current to a third driving coil disposed in the second portion, to interact with the magnetic field; means for providing a fourth electric current to a fourth driving coil disposed in the third portion, to interact with the magnetic field; and means for providing a fifth electric current to a fifth driving coil disposed in the fourth portion, to interact with the magnetic field, to cause the frame to further rotate around the second axis in response to application of the second electromagnetic force produced by interactions of second, third, fourth, and fifth electric currents with the magnetic field.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:
1. An apparatus, comprising:
a magnetic circuit including first and second magnets disposed opposite each other and magnetized in opposite directions to each other, to produce a magnetic field substantially between the first and second magnets; and
a frame that includes a microelectromechanical system (MEMS) device, and is disposed substantially between the first and second magnets of the magnetic circuit, wherein the MEMS device includes a first driving coil disposed substantially around the MEMS device, and is at least partially rotatable around a first axis of the frame, in response to application of a first electromagnetic force produced by interaction of a first electric current to pass through the first driving coil, with the magnetic field,
wherein the frame further includes a second driving coil disposed within the frame, and is at least partially rotatable around a second axis of the apparatus that is substantially orthogonal to the first axis, in response to application of a second electromagnetic force produced by interaction of a second electric current to pass through the second driving coil, with the magnetic field.

2. The apparatus of claim 1, wherein the first and second driving coils are disposed in the MEMS device and in the frame respectively to provide directions of first and second currents to pass through the first and second driving coils that are, at least in portions of the coils, perpendicular to a direction of the magnetic field, to enable production of the first and second electromagnetic forces.

3. The apparatus of claim 1, wherein the frame and the second driving coil have substantially rectangular shapes, and wherein a perimeter of the second driving coil is smaller than a perimeter of the frame.

4. The apparatus of claim 3, wherein the frame comprises a first portion, a second portion, a third portion, and a fourth portion, wherein the portions are defined at least in part by respective positions of the first and second axis relative to the frame, wherein the second driving coil is disposed in the first portion, wherein the frame further includes:
   a third driving coil disposed in the second portion, to pass a third electric current to interact with the magnetic field;
   a fourth driving coil disposed in the third portion, to pass a fourth electric current to interact with the magnetic field;
   a fifth driving coil disposed in the fourth portion, to pass a fifth electric current to interact with the magnetic field;
   wherein the frame is further rotatable around the second axis in response to application of the second electromagnetic force produced by interactions of the second, third, fourth, and fifth electric currents with the magnetic field.

5. The apparatus of claim 4, wherein the second, third, fourth, and fifth driving coils are connected in series or in pairs, to provide various directions of the second, third, fourth, and fifth electric currents in relation to the magnetic field.

6. The apparatus of claim 5, wherein the second and fifth electric currents are to interact with the magnetic field to produce a first portion of the second electromagnetic force, and wherein the third and fourth electric currents are to interact with the magnetic field to produce a second portion of the second electromagnetic force, and wherein the first and second portions of the second electromagnetic force provide a torque to rotate the frame.

7. The apparatus of claim 1, wherein the first and second coils are connected in series, to provide various directions of the first and second electric currents in relation to the magnetic field.

8. The apparatus of claim 1, wherein the magnetic circuit further includes a base with a substantially flat surface, wherein the base of the magnetic circuit comprises a magnetic material, wherein the first and second magnets are disposed on the substantially flat surface of the base.

9. The apparatus of claim 7, wherein the first and second magnets of the magnetic circuit comprise permanent magnets having substantially rectangular prismatic shapes, to provide the magnetic field substantially between the first and second magnets.

10. The apparatus of claim 8, wherein the MEMS device comprises a mirror and is further disposed above a plane formed by top surfaces of the first and second magnets, to provide an unobstructed field of view (FOV) for the mirror when the MEMS device is rotated.

11. The apparatus of claim 1, further comprising a die to form a body of the MEMS device, wherein the die comprises the second axis, and wherein the apparatus comprises an integrated circuit.

12. An apparatus, comprising:
   a processor; and
   an optical scanner module coupled with the processor to provide scan data to the processor, wherein the optical scanner module includes a magnetic circuit to produce a magnetic field, and a frame that includes a microelectromechanical (MEMS) device to generate the scan data, and that is disposed substantially inside the magnetic field, wherein the MEMS device includes a first driving coil disposed substantially around the MEMS device, and is at least partially rotatable around a first axis coupled with the frame, in response to application of a first electromagnetic force produced by interaction of a first electric current to pass through the first driving coil, with the magnetic field, wherein the frame further includes a second driving coil disposed within the frame, and is at least partially rotatable around a second axis that is coupled with the apparatus to be substantially orthogonal to the first axis, in response to application of a second electromagnetic force produced by interaction of a second electric current to pass through the second driving coil, with the magnetic field.

13. The apparatus of claim 12, wherein the magnetic circuit includes first and second magnets disposed opposite each other and magnetized in opposite directions to each other to produce the magnetic field, wherein the frame is disposed substantially between the first and second magnets of the magnetic circuit.

14. The apparatus of claim 12, wherein the frame and the second driving coil have substantially rectangular shapes, wherein a perimeter of the second driving coil is smaller than a perimeter of the frame.

15. The apparatus of claim 14, wherein the frame comprises a first portion, a second portion, a third portion, and a fourth portion, wherein the portions are defined at least in part by respective positions of the first and second axis relative to the frame, wherein the second driving coil is disposed in the first portion, wherein the frame further includes:
   a third driving coil disposed in the second portion, to pass a third electric current to interact with the magnetic field;
   a fourth driving coil disposed in the third portion, to pass a fourth electric current to interact with the magnetic field;
   a fifth driving coil disposed in the fourth portion, to pass a fifth electric current to interact with the magnetic field;
   wherein the frame is further rotatable around the second axis in response to application of the second electromagnetic force produced by interactions of the second, third, fourth, and fifth electric currents with the magnetic field.

16. The apparatus of claim 15, wherein the second, third, fourth, and fifth driving coils are connected in series or in pairs, to provide various directions of the second, third, fourth, and fifth electric currents in relation to the magnetic field.

17. The apparatus of claim 12, wherein the apparatus comprises a three-dimensional (3D) object acquisition device, wherein the device includes one of a 3D scanner, a 3D camera, a 3D projector, an ultrabook, or a gesture recognition device.

18. A method of actuating a microelectromechanical system (MEMS) device of an apparatus, comprising:
   providing a first electric current to pass through a first driving coil disposed substantially around a MEMS device, to cause the MEMS device to rotate around a first axis coupled with a frame in which the MEMS device is disposed in the apparatus, in response to application of a first electromagnetic force produced by interaction of the first electric current with a magnetic field produced by a magnetic circuit of the apparatus;
   providing a second electric current to pass through a second driving coil disposed within the frame, to cause the frame to rotate around a second axis that is coupled with the apparatus to be substantially orthogonal to the first axis, in response to application of a second electromagnetic force produced by interaction of the second electric current with the magnetic field.

19. The method of claim 18, further comprising: causing the magnetic circuit of the apparatus to produce the magnetic field, wherein the magnetic circuit includes first and second magnets disposed opposite each other and magnetized in opposite directions to each other to produce the magnetic field, wherein the frame is substantially disposed between the first and second magnets.

20. The method of claim 18, wherein the frame and the second driving coil have substantially rectangular shapes, wherein a perimeter of the second driving coil is smaller than a perimeter of the frame.

21. The method of claim 20, wherein the frame comprises a first portion, a second portion, a third portion, and a fourth portion, wherein the portions are defined at least in part by respective positions of the first and second axes relative to the frame, wherein the second driving coil is disposed in the first portion of the frame, wherein the method further includes:
  providing a third electric current to a third driving coil disposed in the second portion, to interact with the magnetic field;
  providing a fourth electric current to a fourth driving coil disposed in the third portion, to interact with the magnetic field; and
  providing a fifth electric current to a fifth driving coil disposed in the fourth portion, to interact with the magnetic field, to cause the frame to further rotate around the second axis in response to application of the second electromagnetic force produced by interactions of the second, third, fourth, and fifth electric currents with the magnetic field.

22. The method of claim 21, wherein providing second, third, fourth, and fifth electric currents includes providing a sixth current to the second, third, fourth, and fifth driving coils, wherein the coils are connected in series or in pairs.

* * * * *